United States Patent [19]

Kapoor

[11] Patent Number: 5,543,643
[45] Date of Patent: Aug. 6, 1996

[54] COMBINED JFET AND MOS TRANSISTOR DEVICE, CIRCUIT

[75] Inventor: Ashok K. Kapoor, Palo Alto, Calif.

[73] Assignee: LSI Logic Corporation, Milpitas, Calif.

[21] Appl. No.: 502,566

[22] Filed: Jul. 13, 1995

[51] Int. Cl.$^6$ .......................... H01L 29/80; H01L 31/112; H01L 29/76
[52] U.S. Cl. ............................ 257/262; 257/272; 257/408
[58] Field of Search ...................................... 257/262, 256, 257/260, 265, 270, 272, 408, 412

[56] References Cited

U.S. PATENT DOCUMENTS 5,418,392  5/1995  Tanabe ..................................... 257/408

FOREIGN PATENT DOCUMENTS 1-102964  4/1989  Japan ..................................... 257/262

*Primary Examiner*—Wael M. Fahmy
*Attorney, Agent, or Firm*—Albert C. Smith

[57] ABSTRACT

A transistor circuit is formed on a substrate having source and drain electrodes and multiple current-controlling gates. The two current-controlling gates are separated by spacer oxide material. The first gate is an metal oxide semiconductor (MOS) gate that is insulated from the substrate by a layer of gate oxide. The second gate is a junction field effect transistor (JFET) gate contiguous to the MOS gate that is insulated from the MOS gate by a layer of spacer oxide.

6 Claims, 4 Drawing Sheets

COMBINED JFET AND MOS TRANSISTOR DEVICE, CIRCUIT

TECHNICAL FIELD

This invention relates to semiconductor circuits and methods, and more particularly to semiconductor circuits and methods including metal oxide semiconductor and junction field effect transistors.

BACKGROUND

Conventionally, metal oxide semiconductor (MOS) transistors are fabricated on predoped semiconductor substrates. A typical MOS transistor has a source, a gate, and a drain. The gate is separated from the predoped substrate by an insulative layer. Electric current flows in a channel between source and drain under control of voltages applied to the gate. In particular, electric current flow in the channel can be modulated by applying time-varying signal voltages to the gate electrode. An electric potential applied to the gate electrode either enhances or depletes the channel region of its ability to transmit current, and thereby controls the flow of current between the source and drain electrodes.

Junction field effect transistors (JFETs), on the other hand, have a PN junction at the gate which can be reverse biased by the application of a voltage to the gate. The gate PN junction accordingly controls the channel current by varying the extent of a depletion region which in turn narrows or widens the channel.

MOS transistors are widely used for analog applications. However, they have undesirable noise characteristics and suffer slow operating speeds. Semiconductor circuits and methods promoting improved noise characteristics and faster current modulation are desirable.

SUMMARY OF THE INVENTION

In accordance with the present invention, a high frequency metal oxide semiconductor (MOS) transistor is fabricated to include a junction field effect transistor (JFET) control gate and to exhibit improved noise characteristics and faster current modulation. In particular, a hybrid transistor according to the present invention is fabricated with gate electrodes of two kinds. A first gate electrode is an MOS gate which modulates the current by the application of a gate voltage to produce an electric field to either enhance or deplete the channel region. A second gate electrode is a junction field effect transistor (JFET) gate which controls the channel current by varying the extent of a depletion region which in turn narrows or widens the channel. The JFET gate acts as the primary controlling gate, thereby reducing noise produced by the device and increasing its speed.

In one embodiment of the present invention, a hybrid transistor includes two current-controlling gates separated electrically by an oxide spacer. The first gate is an MOS gate and is electrically isolated from a substrate by a layer of gate oxide. The second gate is a JFET gate formed over a diffusion region adjacent to the MOS gate. These JFET and MOS gates are electrically isolated by a vertical spacer layer of oxide material.

In accordance with the present invention, a hybrid transistor is formed on a substrate using an MOS fabrication process according to which a layer of insulating spacer oxide is formed over the substrate after the MOS gate has been constructed. The oxide layer is then anisotropically etched to remove excess oxide from the horizontal surfaces of the substrate, from the MOS gate already constructed. The oxide which remains on the vertical surfaces of the MOS gate forms a spacer to isolate the JFET gate which is formed on the substrate.

DESCRIPTION OF THE PREFERRED EMBODIMENT

Figure 1:
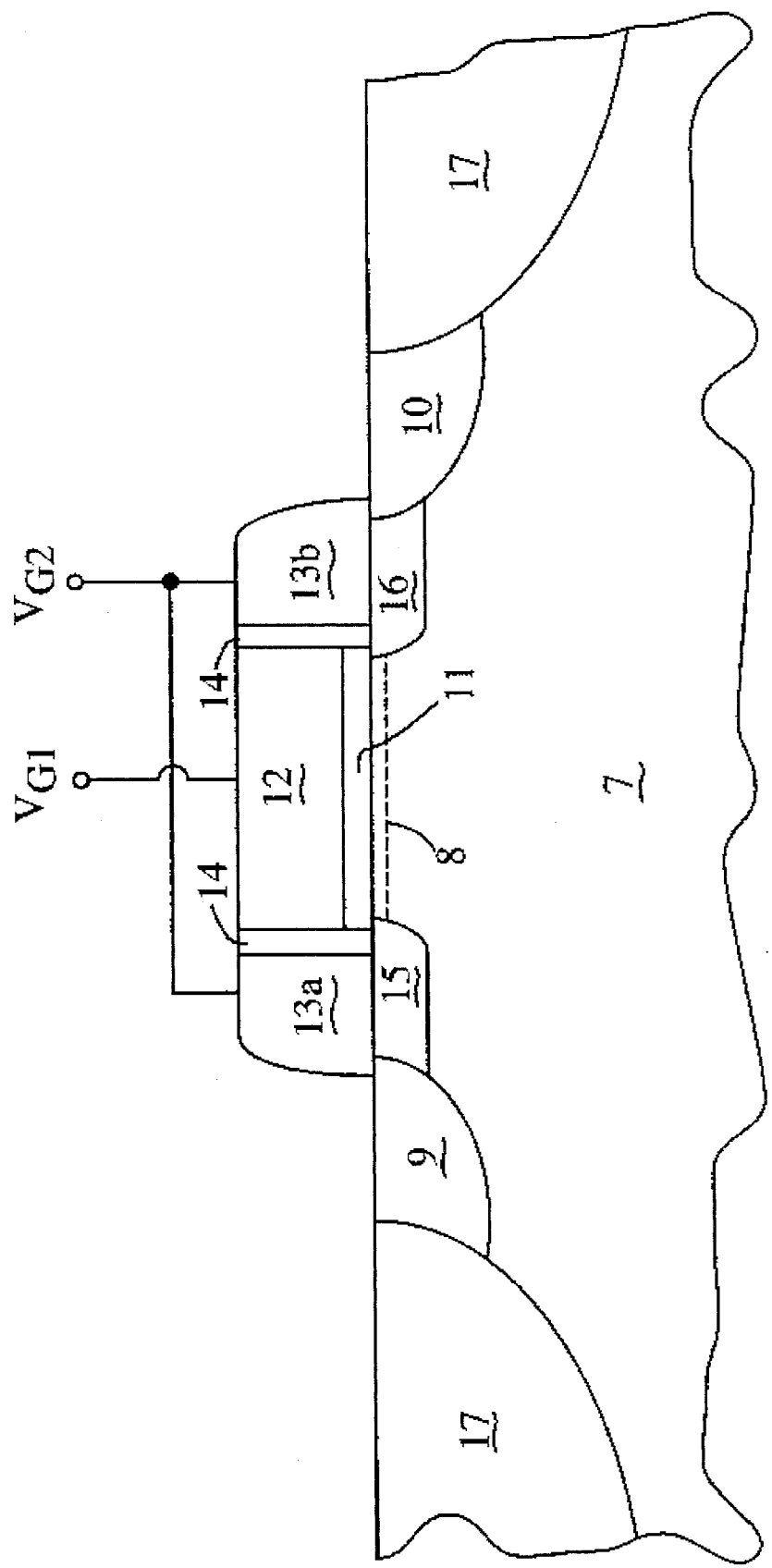
FIG. 1 is cross-sectional diagram of a combined MOS-JFET circuit structure according to the present invention.

FIG. 1 is a cross-sectional diagram of a semiconductor structure 6 including a substrate 7 of a semiconductor crystal such as silicon, according to one embodiment of the present invention. Substrate 7 is p-doped or provided with a p-well to a suitable threshold voltage level in accordance with conventional silicon semiconductor fabrication techniques. Semiconductor structure 6 further includes a channel region 8, a source region 9, and a drain region 10, an MOS gate insulating layer 11, an MOS gate electrode 12, a JFET gate electrode 13, a spacer insulating layer 14, first and second lightly doped drain (LDD) regions respectively 15 and 16, and a field oxide region 17. LDD regions 15 and 16 act as a JFET channel which can be modulated by signal on JFET gate electrode 13. According to one embodiment of the present invention, a single one of LDD regions 15, 16 can be employed to implement the present invention. Source region 9, and drain region 10 are n-type source and drain regions according to an embodiment of the present invention.

P-well region 8 is a diffusion region of semiconductor material that is doped with "acceptor" or p-type impurities of boron, for example, at a concentration of on the order of $1\times10^{14}$ to on the order of $1\times10^{16}/cm^3$. According to one embodiment of the present invention, respective source and drain regions 9 and 10 are doped with "donor" or n-type impurities to form a semiconductor region including phosphorus, arsenic, or the like, at a concentration of on the order of $1\times10^{15}$ to on the order of $1\times10^{16}/cm^3$. MOS gate insulating layer 11 is fabricated from silicon dioxide ($SiO_2$), for example, grown on the surface of substrate 7. MOS gate electrode 12 is a conductive material such as polysilicon (poly) doped with n-type material. JFET gate electrode 13 is a conductive material such as polysilicon doped with p-type material. According to one embodiment of the invention, spacer insulating layer 14 is an oxide such as silicon dioxide which can be either grown or deposited on substrate 7.

Spacer insulating layer 14 is substantially over the horizontal surface of substrate 7, and it electrically isolates MOS gate electrode 12 from JFET gate electrode 603. LDD regions 15, 16 are regions in p-well region 8 that are lightly doped with n-type material. Lightly doped means doped to an impurity concentration less than the impurity concentration of the source and drain regions 9 and 10, for example, using phosphorus, arsenic, or the like, to a concentration on the order of $1\times10^{15}$ to on the order of $1\times10^{19}/cm^3$. Field oxide region 17 is an insulating material such as silicon dioxide that is grown during fabrication for electrically isolating adjacent semiconductor devices.

In one embodiment, MOS gate electrode 12 and JFET gate electrode 13 may be electrically connected to simultaneously modulate the current flowing through the hybrid device. In another embodiment, MOS gate electrode 12 is electrically connected to the drain diffusion region 10 such that the JFET gate electrode 13 can be used to control the current flowing through hybrid transistor 600. Applying a negative bias to JFET gate 603 expands the depletion region in the channel and "pinches off" the drain current.

Figure 2A:
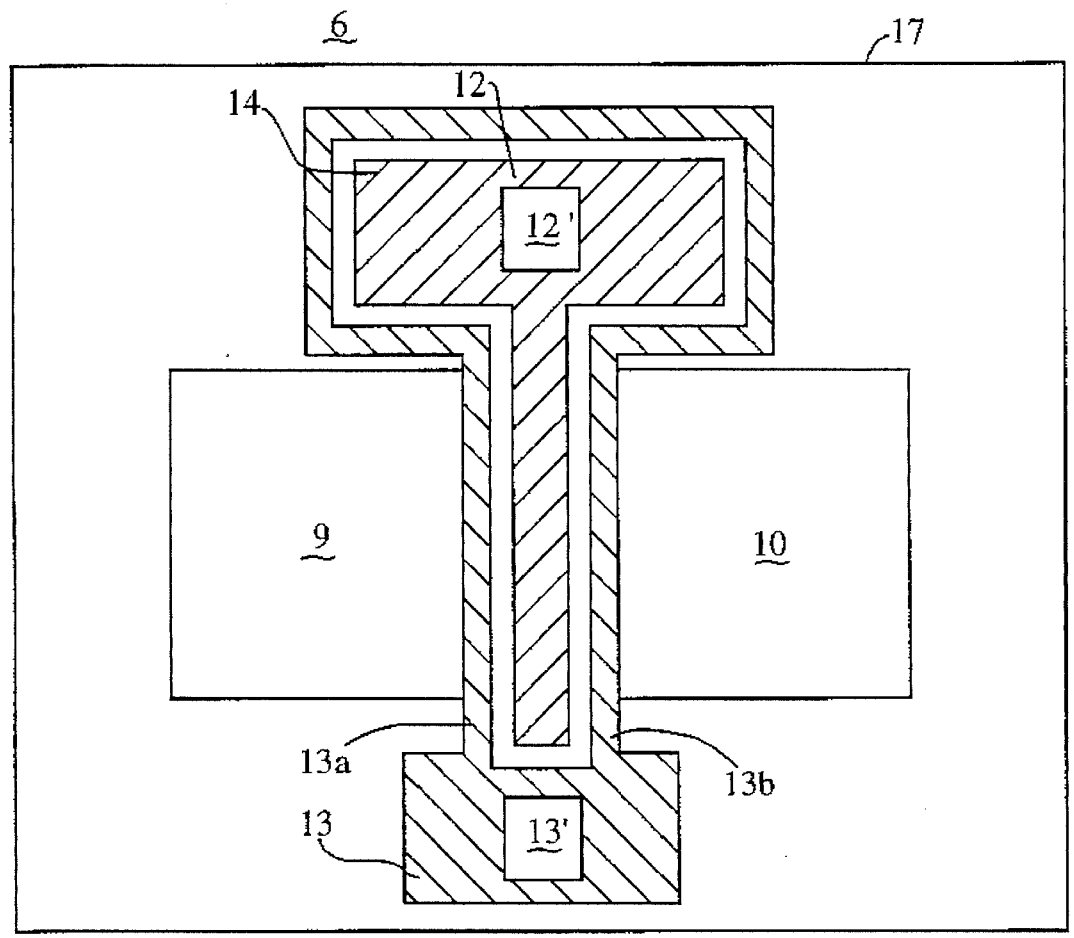
FIG. 2a is a top view of a combined MOS-JFET circuit according to the present invention.

FIG. 2a is a top view of semiconductor structure 6 in accordance with the present invention. Source and drain regions 9, 10 are separated by JFET gate electrode 13 and MOS gate electrode 12. MOS gate electrode 12 and JFET gate electrode 13 are electrically isolated by spacer insulating layer 14. The JFET gate contact 13' is also shown fabricated over JFET gate electrode 13. Field oxide region 17 electrically isolates the electrical components fabricated in semiconductor substrate 7. As is apparent in FIG. 2a, JFET gate electrode is a polygate structure having first and second electrode arms 13a and 13b, according to an embodiment of the present invention. In particular, electrode arm 13a is adjacent source region 9, and electrode arm 13b is adjacent drain region 10.

Figure 2B:
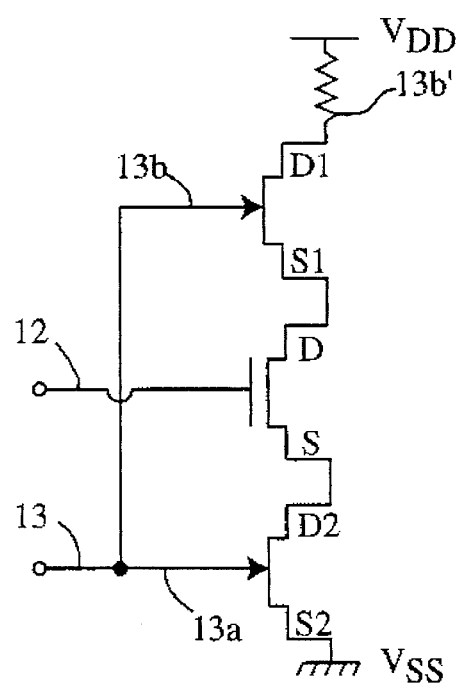
FIG. 2b is a circuit diagram representation of the semiconductor structure according to the present invention, including adjacent MOS gate and JFET gate electrodes.

FIG. 2b is a circuit diagram representation of semiconductor structure 6 including MOS gate electrode 12 and JFET gate electrode 13. Semiconductor structure 6 and series load resistor 13b' are shown connected between $V_{DD}$ and ground, e.g., $V_{SS}$. According to one embodiment of the present invention, an input signal is modulated by controlling the signal at the JFET gate electrode 13. The bias point is set by a signal applied to MOS gate electrode 12, thereby providing a certain DC current level and conducting signal modulation superimposed thereover by the variation provided at the JFET gate electrode 13. The present invention thereby provides a very compact structure for setting the bias point by MOS and controlling and amplifying the variable signal applied through the JFET gate electrode 13, to produce a desired output signal at D1 for example.

Figure 3:
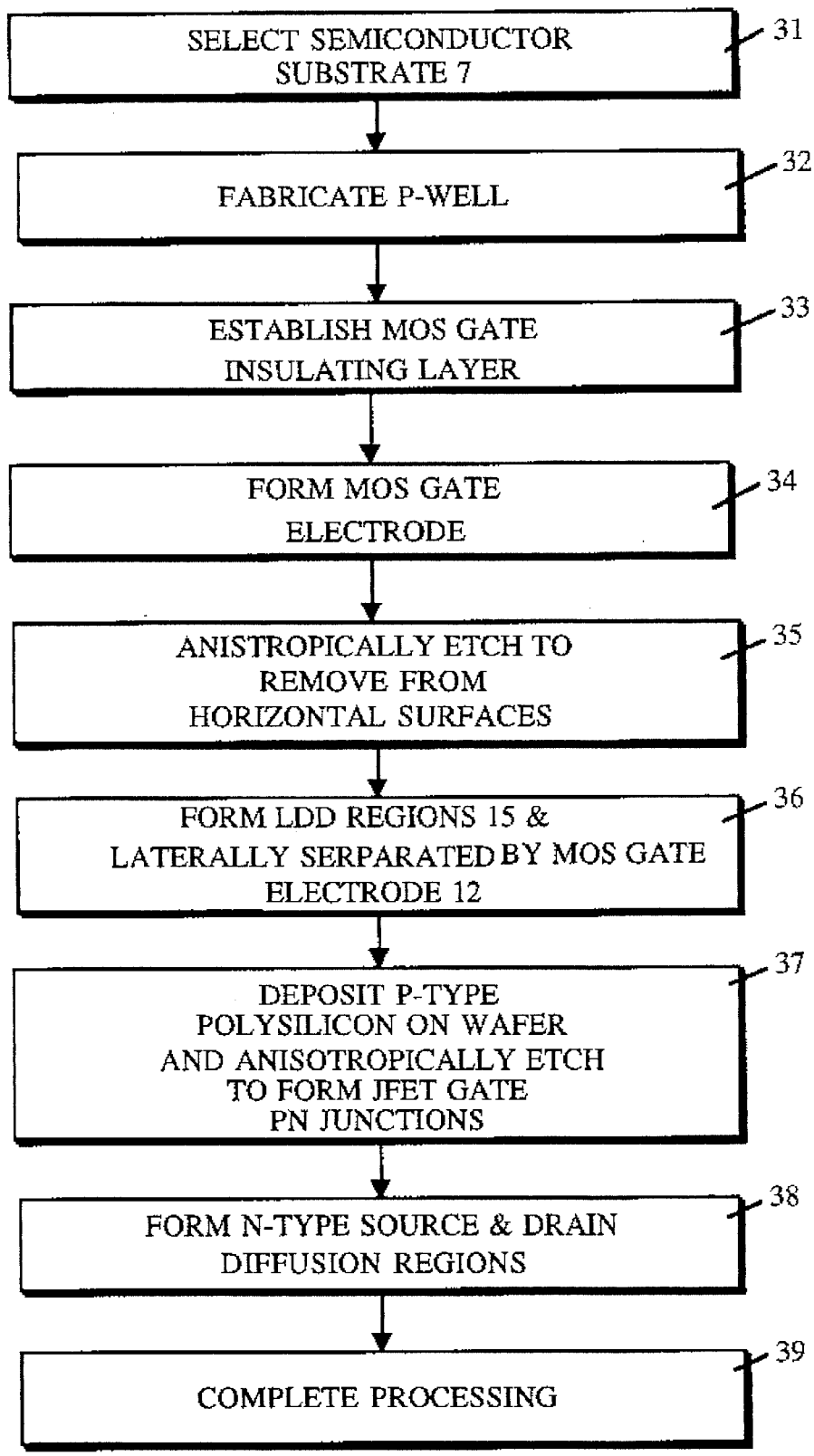
FIG. 3 is a flow chart of fabrication steps of a combined MOS-JFET circuit according to the present invention.

FIG. 3 is a flow diagram of processing steps for fabricating semiconductor structure 6 in accordance with the present invention. According to one embodiment of the present invention, a predoped semiconductor substrate 7 of a desired semiconductor material such as silicon, for example, is selected 30 for processing. Typically, the selected semiconductor material will be a silicon wafer cut from a single silicon crystal. Next, a p-well region is fabricated 31 in semiconductor substrate 7 and is provided with a field oxide region 17 for isolation. If substrate 7 is suitably predoped with p-material, no separate establishment of a p-well is required. As applicable, the p-well region and field oxide region 17 are fabricated using conventional photolithographic processing techniques and equipment. In particular, silicon dioxide ($SiO_2$) for field oxide region 17 is grown and selectively removed using selected photoresist materials, a photomask, and selectively etching the materials used in processing to establish the needed isolation region surrounding the electrical elements being fabricated. According to one embodiment of the present invention, field oxide region 17 is formed by the following isoplanar process: (1) the upper surface of substrate 7 is oxidized, then coated with a layer of silicon nitride; (2) portions of the silicon nitride are patterned photolithographically and removed from selected areas; and (3) the residual silicon nitride is removed.

More particularly, a p-well region is formed by selectively removing the oxide layer grown on substrate 7 which is then implanted with a p-type impurity dopant such as boron. After the dopant is implanted, substrate 7 is heated to selectively diffuse the dopant impurities into the silicon crystalline structure of substrate 7 to form p-well region 8.

MOS gate insulating layer 11 is established 32 on substrate 7 by oxide growth processing. After establishing MOS gate insulating layer 11, MOS gate electrode 12 is formed 33 by depositing polysilicon on MOS gate insulating layer 11. The polysilicon of MOS gate electrode 12 is then doped with n-type material. Next, spacer insulating layer 14 is formed 34 at the sides of MOS gate electrode 12 by growing or depositing spacer oxide over substrate 7 and MOS gate electrode 12 to between 100 to 3000 Angstroms thick. The final form of spacer insulating layer 14 is then produced by anisotropic etching 35 that substantially removes the spacer oxide material from all horizontal surfaces to form the final spacer insulating layer 14 at the desired location at the vertical surfaces at the edges of MOS gate electrode 12 and MOS gate insulating layer 11.

Next, LDD regions 15 and 16 are formed 36 such that LDD regions 15 and 16 are laterally separated by the p-well region below MOS gate electrode 12. LDD regions 15, 16 form a junction with MOS gate electrode 12 which is formed by depositing polysilicon on the substrate and then anisotropically etching the polysilicon to remove the polysilicon from the horizontal surfaces. LDD regions 15, 16 are regions in p-well region 8 that are lightly doped with n-type material. Lightly doped means doped to an impurity concentration less than the impurity concentration of the source and drain regions 9 and 10, for example, using phosphorus, arsenic, or the like, to a concentration on the order of $1\times10^{20}$ to on the order of $1\times10^{21}/cm^3$.

Next, a layer of polysilicon is deposited 37, which may be already doped p+ or it can be doped after being deposited. The polysilicon is anisotropically etched and the polysilicon which remains is immediately contiguous with spacer insulating layer 14 and is also immediately contiguous LDD regions 15, 16. JFET gate electrode 13 is further fabricated and doped to form a PN junction where gate electrode 13 is immediately contiguous with LDD regions 15, 16.

Finally, standard MOS processes are used to form 38 source and drain regions 9, 10, by doping with arsenic, for example, as discussed above, and to complete 39 processing of semiconductor structure 6.

Figure 4A:
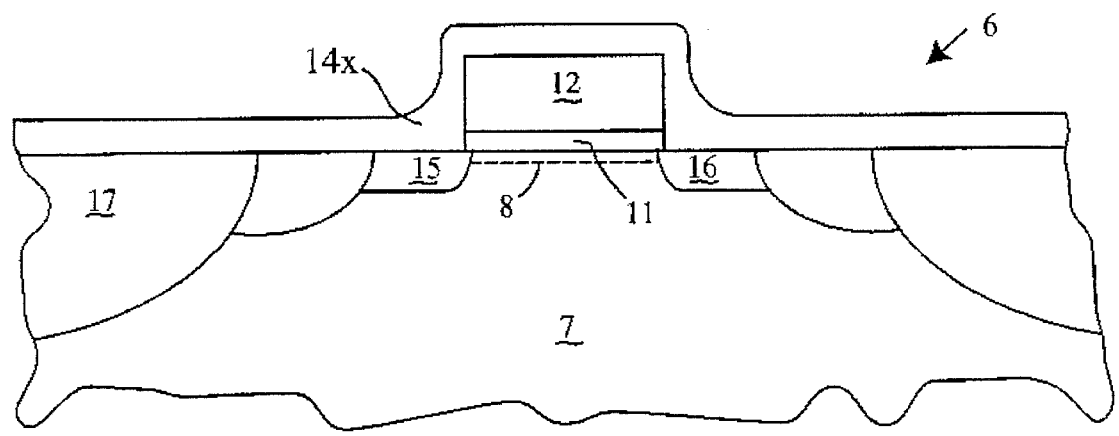
FIG. 4a is a cross-sectional diagram showing formation of spacer insulating layer at the sides of an MOS gate electrode by growing or depositing spacer oxide over a substrate and an MOS gate electrode, in connection with the present invention.

FIG. 4a is a cross-sectional diagram showing formation of spacer insulating layer 14 at the sides of MOS gate electrode 12 by growing or depositing spacer oxide over substrate 7 and MOS gate electrode 12. In particular, after growth or deposition, the spacer oxide is photolithographically removed in selected regions to leave behind the desired spacer insulating layer 14. The final form of spacer insulating layer 14 is produced by anisotropic etching 35 which substantially removes the spacer oxide material from all horizontal surfaces to form the final spacer insulating layer 14 at the desired location at the vertical surfaces at the edges of MOS gate electrode 12 and MOS gate insulating layer 11.

Anisotropic etching is an etching process that preferentially etches in a vertical direction. In other words, its vertical etching rate is much greater than its horizontal etching rate. In the preferred embodiment of the present invention, anisotropic etching is performed by reactive-ion etching, a commonly used anisotropic etching process. Reactive-ion etching has the added advantage of a high silicon dioxide-to-silicon etch ratio, so that the desired removal of silicon dioxide occurs at a far faster rate than does the undesired removal of silicon. The reactive-ion etching of silicon dioxide over silicon is well known and may be carried out using commercially available equipment. Anisotropic etching continues until all oxide is removed from the horizontal upper surfaces being etched. The etching process exposes the horizontal upper surfaces before it reaches the vertical side walls because the vertical thickness of the oxide is thinner above the horizontal surfaces than above the inner corners, and because the etching action is vertically preferential. When the oxide has been removed from the horizontal upper surfaces, a residual amount of oxide remains on the vertical side walls. The residual oxide on the side walls provides the desired electrical separation between MOS gate electrode 12 and JFET gate electrode 13. The thickness of spacer insulating layer 11 is controlled by the isotropic etching process, not photolithographically. Accordingly, the thickness of the spacer oxide in spacer insulating layer 11 is not limited by the alignment precision of photolithography. Three parameters control the thickness of the spacer insulating layer 11; namely: vertical-to-horizontal etching ratio; duration of the etching process; and thickness of the oxide layer. An anisotropic etching process with a lower vertical-to-horizontal etching ratio will form thinner spacer oxide layers.

Figure 4B:
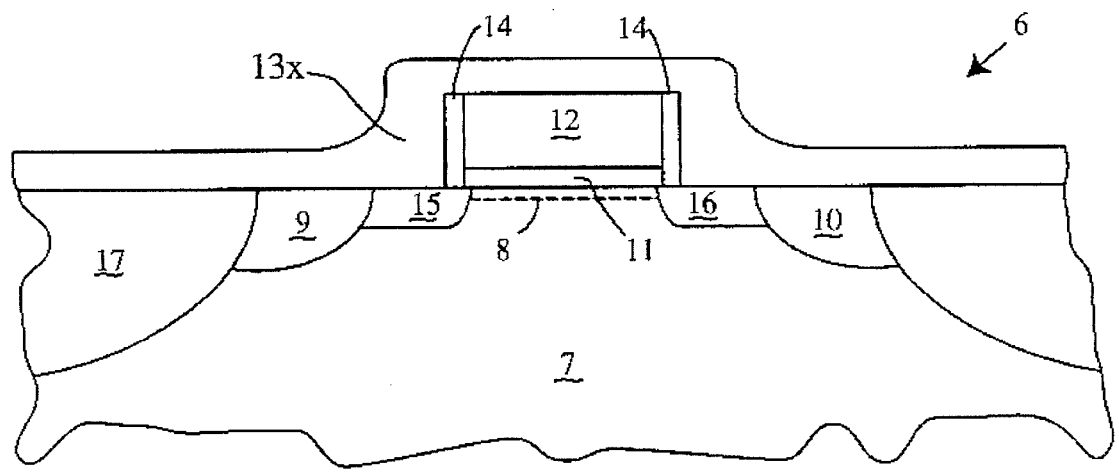
FIG. 4b is a cross-sectional diagram showing deposition of p-type polysilicon at the sides of an MOS gate electrode, in accordance with the present invention.
Figure 4C:
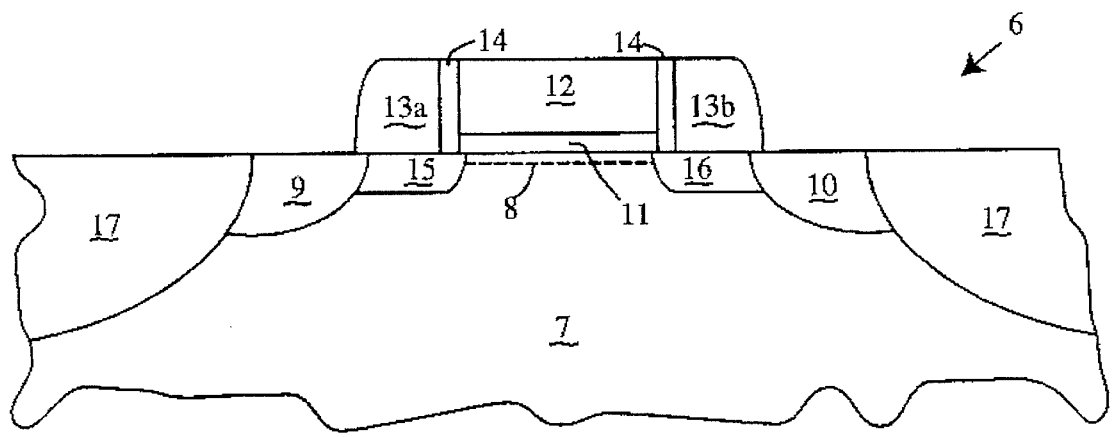
FIG. 4c is a cross-sectional diagram showing completion of the JFET polygate electrode according to the present invention.

FIG. 4b is a cross-sectional diagram showing deposition of p-type polysilicon 13x at the sides of MOS gate electrode 12. FIG. 4c is a cross-sectional diagram showing completion of the JFET polygate electrode 13 according to the present invention. In particular, anisotropic etching removed the horizontally facing surfaces of polysilicon, leaving first and second electrode arms respectively 13a and 13b of JFET electrode 13.

The above-mentioned process describes the fabrication of a hybrid MOS-JFET transistor having a p-type polysilicon JFET gate electrode and an n-type polysilicon MOS gate electrode. A hybrid MOS-JFET transistor may similarly be fabricated by complementing the dopants to yield a hybrid device having an n-type polysilicon JFET gate electrode and a p-type polysilicon MOS gate electrode.

Conductivity types herein are ranges of excess electron or hole concentrations. Types and ranges can be overlapping.

I claim:

1. A semiconductor device comprising:
   a semiconductor substrate of a first conductivity type;
   a source diffusion region of a second conductivity type formed in the semiconductor substrate;
   a drain diffusion region of the second conductivity type formed in the semiconductor substrate and laterally separated from the source diffusion region;
   a first layer of insulating material formed on the semiconductor substrate, between the source and drain diffusion regions;
   a first gate electrode formed on the first layer of insulating material, the first gate electrode having side surfaces;
   a layer of insulating material formed on each side surface for electrically isolating the first gate electrode;
   a junction field effect transistor (JFET) gate electrode of the first conductivity type deposited on the semiconductor substrate, said JFET gate electrode being immediately contiguous to the insulating layers formed on the side surfaces of the MOS gate electrode and immediately contiguous to the substrate surface; and
   first and second lightly doped drain regions formed in the substrate between the source and drain diffusion regions and immediately contiguous with the JFET gate electrode to form JFET gate junctions.

2. The semiconductor device of claim 1 wherein the source and drain diffusion regions have a first dopant impurity concentration and the LDD regions have a second dopant impurity concentration less that the first dopant impurity concentration.

3. The semiconductor device of claim 1 wherein the first conductivity type is n-type and the second conductivity type is p-type.

4. The semiconductor device of claim 1 wherein the first conductivity type is p-type and the second conductivity type is n-type.

5. The semiconductor device of claim 1 wherein said first gate electrode is a metal oxide semiconductor (MOS) gate electrode.

6. The semiconductor device of claim 1 wherein said first gate electrode has a conductivity which is different from the conductivity of said first conductivity type.

\* \* \* \* \*